(12) United States Patent
Frantzeskakis et al.

(10) Patent No.: US 8,742,856 B2
(45) Date of Patent: Jun. 3, 2014

(54) FREQUENCY SYNTHESIS USING A RING OSCILLATOR

(75) Inventors: Manolis Frantzeskakis, Ilioupolis (GR); Georgios Srikas, Glyfada (GR); Henrik Jensen, Long Beach, CA (US); Yushi Tian, San Diego, CA (US); Jianfeng Shi, Carlsbad, CA (US)

(73) Assignee: Broadcom Corporation, Irvine, CA (US)

( * ) Notice: Subject to any disclaimer, the term of this patent is extended or adjusted under 35 U.S.C. 154(b) by 43 days.

(21) Appl. No.: 13/436,564

(22) Filed: Mar. 30, 2012

(65) Prior Publication Data

US 2013/0113573 A1    May 9, 2013

Related U.S. Application Data

(60) Provisional application No. 61/556,094, filed on Nov. 4, 2011.

(30) Foreign Application Priority Data

Mar. 26, 2012  (GR) ............................... 20120100177

(51) Int. Cl.
*H03K 3/03*  (2006.01)
(52) U.S. Cl.
USPC ........................................... 331/57; 331/185

(58) Field of Classification Search
USPC ........................................ 331/34, 45, 57, 185
See application file for complete search history.

(56) References Cited

U.S. PATENT DOCUMENTS

| | | | | |
|---|---|---|---|---|
| 5,036,216 | A * | 7/1991 | Hohmann et al. | 327/157 |
| 6,137,371 | A * | 10/2000 | Fukaishi | 331/57 |
| 6,204,694 | B1 * | 3/2001 | Sunter et al. | 326/93 |
| 6,803,831 | B2 * | 10/2004 | Nishikido | 331/57 |
| 6,842,082 | B2 * | 1/2005 | Tan | 331/175 |
| 6,992,536 | B2 * | 1/2006 | Kiyose et al. | 331/177 R |
| 7,138,879 | B2 * | 11/2006 | Su | 331/74 |
| 7,538,626 | B2 * | 5/2009 | Yamaguchi et al. | 331/57 |
| 7,876,163 | B2 * | 1/2011 | Hachigo | 331/16 |
| 7,969,250 | B2 * | 6/2011 | Boerstler et al. | 331/57 |
| 8,253,498 | B2 * | 8/2012 | Yagishita et al. | 331/16 |
| 8,427,245 | B2 * | 4/2013 | Sandhu | 331/57 |
| 2011/0057736 | A1 * | 3/2011 | Badillo | 331/57 |

* cited by examiner

*Primary Examiner* — Levi Gannon
(74) *Attorney, Agent, or Firm* — Sterne, Kessler, Goldstein & Fox P.L.L.C.

(57) ABSTRACT

The present disclosure is directed to a method and apparatus for providing an output oscillating signal at a desired frequency. In at least one example, the apparatus includes a weak inversion structure configured to set a small reference current. A current mirror configured to provide a replica current based on the small reference current and a tuning word. A ring oscillator is configured to be powered by a supply at a voltage determined based on the replica current. The tuning word is adjustable to change the voltage such that the ring oscillator provides the output oscillating signal at the desired frequency.

19 Claims, 4 Drawing Sheets

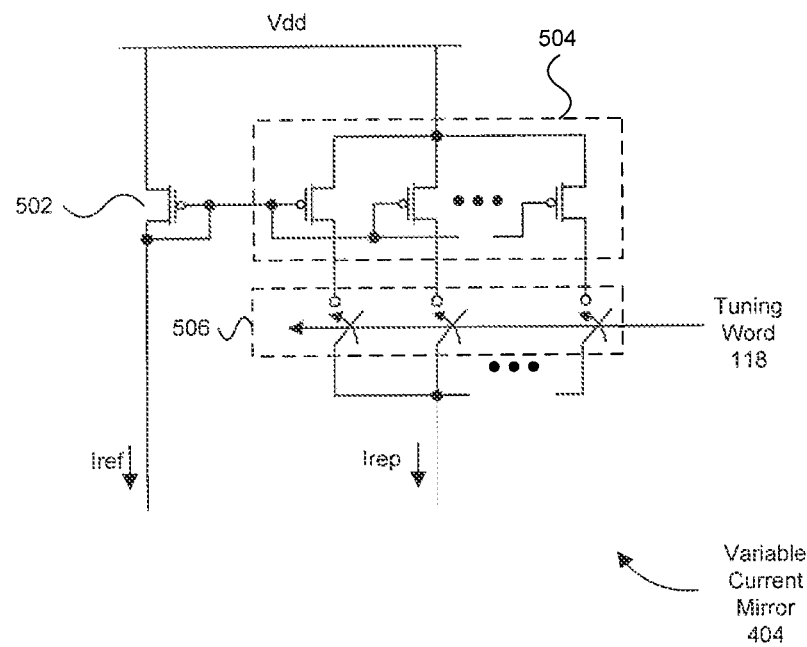
*FIG. 5*
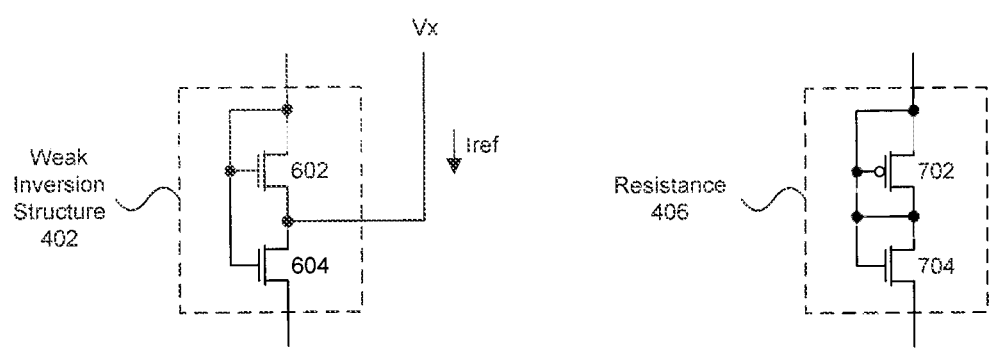
*FIG. 6*   *FIG. 7*

US 8,742,856 B2

FREQUENCY SYNTHESIS USING A RING OSCILLATOR

CROSS REFERENCE TO RELATED APPLICATIONS

This application claims the benefit of U.S. Provisional Patent Application No. 61/556,094, filed Nov. 4, 2011.

FIELD OF THE INVENTION

This application relates generally to ring oscillators and more particularly to frequency synthesis using ring oscillators.

BACKGROUND

A frequency locked loop (FLL) uses a controllable oscillator (e.g., a digitally controlled oscillator) to generate an output signal from a given input signal. Typical designs for the controllable oscillator include crystal oscillators, surface acoustic wave oscillators, LC-tank oscillators, and ring oscillators. Of these types of oscillators, only LC-tank oscillators and ring oscillators lend themselves to integration on a semiconductor substrate.

While LC-tank oscillators are capable of generating accurate clock signals (e.g., low phase noise), they generally require an off-chip inductor or an on-chip spiral inductor. Integrating a high quality inductor onto a standard semiconductor substrate is not trivial, being limited by parasitic effects and the complexity of added non-standard process steps.

As integrated circuit processes have moved to smaller device dimensions and lower supply voltages, inverter-based ring oscillators have become increasingly more attractive over LC-tank oscillators for many applications. However, despite the reductions in integrated circuit device dimensions and supply voltages, the area and power requirements of inverter-based ring oscillators still present drawbacks to their use. Therefore, what is needed is a ring oscillator implementation requiring less area and/or less power as compared to conventional ring-oscillators.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 5 illustrates an exemplary variable current mirror in accordance with embodiments of the present disclosure.

FIG. 6 illustrates an exemplary weak inversion structure in accordance with embodiments of the present disclosure.

FIG. 7 illustrates an exemplary replica structure in accordance with embodiments of the present disclosure.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

I. DIGITAL FREQUENCY LOCKED LOOP

Figure 1:
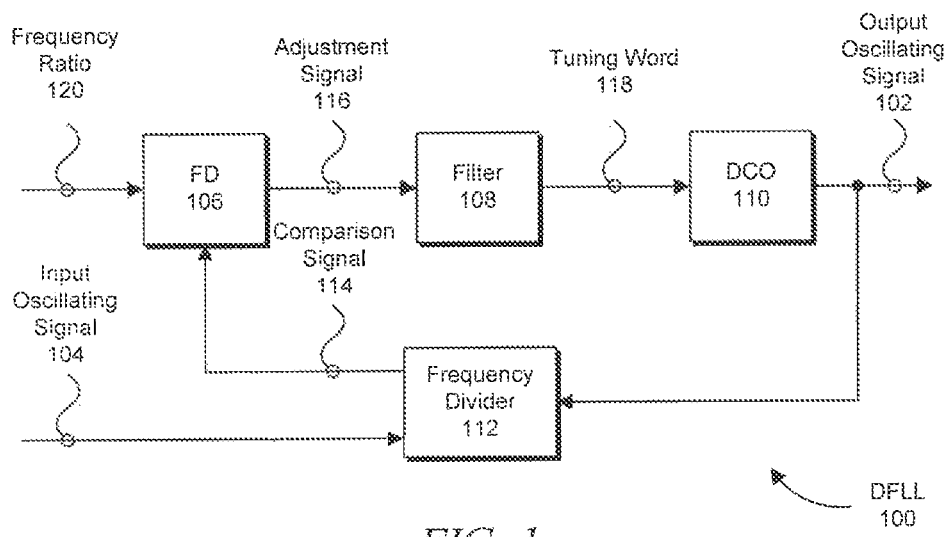
FIG. 1 illustrates an exemplary digital frequency locked loop (DFLL) in accordance with embodiments of the present disclosure.

FIG. 1 illustrates an exemplary block diagram of a digital frequency locked loop (DFLL) 100 in accordance with embodiments of the present disclosure. In general, the DFLL 100 is used to generate an output oscillating signal 102 having a desired output frequency (i.e., $f_{out}$) from an input oscillating signal 104 having a given reference frequency (i.e., $f_{ref}$). Often, the output oscillating signal 102 is a relatively high frequency signal and the input oscillating signal 104 is a relatively low frequency signal (i.e., $f_{out} > f_{ref}$). Accordingly, the DFLL 100 is used to generate the high frequency output oscillating signal 102 from the lower frequency input oscillating signal 104. The input oscillating signal 104 can be considered a reference clock.

As shown in FIG. 1, the DFLL 100 includes a frequency detector (FD) 106, a filter 108, a digitally controlled oscillator (DCO) 110, and a frequency divider 112. The DFLL is arranged as a negative feedback system. An output of the DCO 110 provides the output oscillating signal 102. The frequency divider 112 generates a comparison signal 114 based on the ratio of the frequency of the output oscillating signal 102 to the frequency of the input oscillating signal 104. Specifically, the frequency divider 112 estimates the ratio of the frequency of the output oscillating signal 102 to the frequency of the input oscillating signal 104 using, for example, a counter, and feeds this estimated ratio to the FD 106 as the comparison signal 114.

The FD 106 compares the comparison signal 114 to a desired frequency ratio 120 and generates an adjustment signal 116 proportional to any difference or error between the comparison signal 114 and the desired frequency ratio 120. The desired frequency ratio 120 can be an integer or an integer plus a fractional value. The filter 108 accumulates samples of the adjustment signal 116 (i.e., integrates the adjustment signal 116) to provide a tuning word 118. The tuning word 118 is used to adjust the frequency of the output oscillating signal 102 provided by DCO 110 to correct for any frequency difference between the comparison signal 114 and the desired frequency ratio 120. In this way, the DFLL 100 uses feedback to continuously monitor and adjust the frequency of the output oscillating signal 102.

Figure 2:
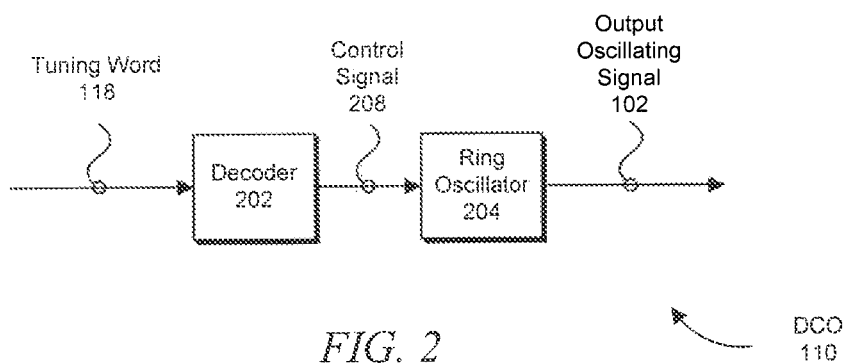
FIG. 2 illustrates an exemplary digital controlled oscillator (DCO) in accordance with embodiments of the present disclosure.

FIG. 2 illustrates an exemplary block diagram of the DCO 110 according to embodiments of the present disclosure. As shown in FIG. 2, the DCO 110 includes a decoder 202 and a ring oscillator 204 with a programmable frequency. Decoder 202 formats the tuning word 118 for the particular implementation of the ring oscillator 204. More specifically, the decoder 202 formats the tuning word 118 into a control signal 208 that is suitable to control the ring oscillator 204 such that the ring oscillator 204 provides the output oscillating signal 102 at a frequency designated by the tuning word 118.

For example, tuning word 118 can be a digital value and the frequency of the ring oscillator 204 can be controlled by a voltage (i.e., ring oscillator 204 is a voltage controlled ring oscillator). In this instance, the decoder 202 can format the digital value of the tuning word 118 into a suitable voltage signal to control the ring oscillator 204 such that the ring oscillator 204 provides the output oscillating signal 102 at a frequency designated by the digital value of the tuning word 118.

Figure 3:
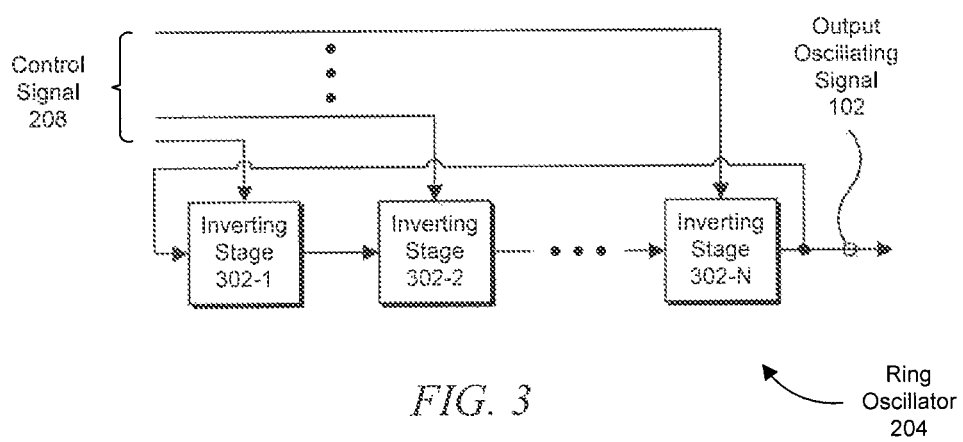
FIG. 3 illustrates an exemplary ring oscillator for a DFLL in accordance with embodiments of the present disclosure.

FIG. 3 illustrates an exemplary block diagram of the ring oscillator 204 in accordance with embodiments of the present invention. As shown in FIG. 3, the ring oscillator 204 includes a plurality of inverting stages 302-1 through 302-N that are coupled in series. Each inverting stage 302-1 through 302-N receives and inverts the output of one of the other inverting stages 302-1 through 302-N. For example, the inverting stage 302-2 receives and inverts the output of the inverting stage 302-1 and provides the inverted output to the inverting stage 302-3 (not shown). The output of the last inverting stage 302-N provides the output oscillating signal 102 and is fed back to the input of the first inverting stage 302-1.

In an embodiment, the ring oscillator 204 includes an odd number of inverting stages 302-1 through 302-N. Given that there is an odd number of inverting stages 302-1 through 302-N, it can be shown that the output of the inverting stage 302-N is the logical NOT or inversion of the initial input to the inverting stage 302-1. Because each of the inverting stages 302-1 through 302-N has an associated delay from the time its input changes to the time its output changes (referred to as a stage or gate delay), the output of the inverting stage 302-N will be asserted some non-zero amount of time after the initial input to the inverting stage 302-1 is asserted. When the output of the inverting stage 302-N eventually responds to the initial input of the inverting stage 302-1 and is fed back to the input of the inverting stage 302-1, the feedback will cause oscillation of the output oscillating signal 102. The frequency of oscillation is approximately equal to the reciprocal of twice the sum of the individual delays of all the inverting stages 302-1 through 302-N included in the ring oscillator 204.

In an embodiment, the ring oscillator 204 can further include non-inverting or buffer stages coupled between the inverting stages 302-1 through 302-N. Because these buffer stages further contribute to delay, the frequency of oscillation of output oscillating signal 102 is approximately equal to the reciprocal of twice the sum of the individual delays of all the inverting stages 302-1 through 302-N and the buffer stages included in the ring oscillator 204.

Control signal 208 controls the stage or gate delay associated with the inverting stages 302-1 through 302-N (and possibly the stage or gate delay of any buffer stages included in the ring oscillator 204). By controlling the delay associated with the inverting stages 302-1 through 302-N, the control signal 208 can adjust the frequency of the output oscillating signal 102. Specifically, the control signal 208 can increase the delay associated with the inverting stages 302-1 through 302-N to decrease the frequency of the output oscillating signal 102. Conversely, the control signal 208 can decrease the delay associated with the inverting stages 302-1 through 302-N to increase the frequency of the output oscillating signal 102.

It should be noted that the inverting stages 302-1 through 302-N can be implemented in either a single-ended or differential-ended configuration. In the instance where the inverting stages 302-1 through 302-N are implemented in a differential-ended configuration, the inverting stages can provide more immunity to noise that couples (commonly) to their differential inputs. In addition, in the instance where the inverting stages 302-1 through 302-N are implemented in a differential-ended configuration, it is possible to use an even number of the inverting stages 302-1 through 302-N to provide oscillation. For example, if the differential output lines of the inverting stage 302-N are swapped before being coupled to the differential input of the inverting stage 302-1, an even number of the inverting stages 302-1 through 302-N can be used.

II. LOW-POWER DECODER

Figure 4:
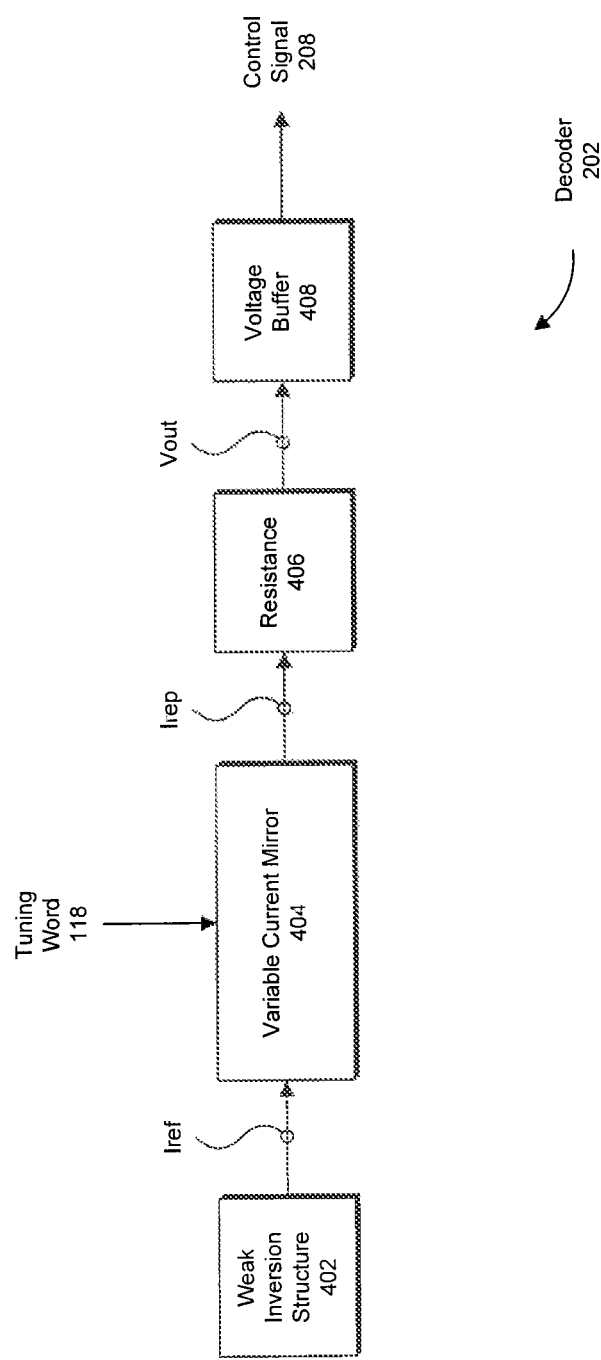
FIG. 4 illustrates an exemplary decoder in accordance with embodiments of the present disclosure.

FIG. 4 illustrates an exemplary block diagram of the decoder 202 configured to consume a small amount of power in accordance with embodiments of the present disclosure. As noted above, the decoder 202 formats the tuning word 118 into the control signal 208 such that the ring oscillator 204 provides the output oscillating signal 102 at a frequency designated by the tuning word 118. In the implementation of FIG. 4, tuning word 118 is a digital value, and decoder 202 formats the digital value into a voltage proportional to the digital value. The proportional voltage is output by the decoder 202 as the control signal 208. Thus, the ring oscillator 204 to be controlled by the control signal 208 is a voltage controlled ring oscillator.

The control signal 208 is specifically used to power one or more of the inverting stages of the ring oscillator 204. In general, the greater the voltage of the control signal 208, the greater the drive strength and smaller the gate delay of the inverting stages of the ring oscillator 204 powered at the voltage of the control signal 208. Thus, increasing the voltage of the control signal 208 correspondingly increases the frequency of the output oscillation signal 102 provided by the ring oscillator 204 and, conversely, decreasing the voltage of the control signal 208 correspondingly decreases the frequency of the output oscillation signal 102 provided by the ring oscillator 204. Because the supply voltage of the ring oscillator 204 is adjusted to change the frequency of the output oscillation signal 102, the number of inverting stages in the ring oscillator 204 car be relatively fewer than other ring oscillator implementations (with a comparative tuning range) that are not programmed via their supply voltages. The use of a smaller number of inverting stages reduces area requirements for the ring oscillator 204 and can save power.

To format the tuning word 118 into the proportional voltage provided as output via the control signal 208, the decoder shown in FIG. 4 includes a weak inversion structure 402, a variable current mirror 404, a resistance 406, and a voltage buffer 408. The weak inversion structure 402 is a self-biased current source that provides a reference current (i.e., Iref). The weak inversion structure 402 includes at least one transistor (e.g., an n-channel or p-channel field effect transistor) operating in the sub-threshold region of operation. The reference current flows through the channel of the at least one transistor operating in the sub-threshold region and, as a result, can be extremely small. The provision of a small reference current helps to reduce the overall power consumption of decoder 202.

The variable current mirror 404 receives the reference current from the weak inversion structure 402 and provides as output a replica current (i.e., Irep) that is approximately proportional to the reference current. Specifically, the reference current sets a saturation current flowing through a diode connected transistor in the variable current mirror 404. This diode connected transistor then controls a saturation current flowing through another transistor with a variable channel width/length ratio. The saturation current flowing through the transistor with the variable channel width/length ratio is the replica current. The replica current is provided as output by the variable current mirror 404.

The replica current is adjusted up or down by the tuning word 118, which controls the transistor with the variable channel width/length ratio. For example, as the digital value of the tuning word 118 increases, the variable channel width/length ratio of the transistor increases, causing the replica current to increase. Conversely, as the digital value of the tuning word 118 decreases, the variable channel width/length ratio of the transistor decreases, thereby causing the replica current to decrease.

The replica current is provided to the resistance 406, which converts the replica current into a voltage (i.e., Vout). For example, the replica current can simply pass through the resistance 406 to generate the voltage or, alternatively, some other current determined or generated based on the replica current can pass through the resistance 406 to generate the voltage. Because the replica current is controlled by the tuning word 118, the voltage produced by the resistance 406 is also controlled by the tuning word 118.

The voltage produced by the resistance 406 is coupled to the (optional) voltage buffer 408. The voltage buffer 408 buffers the voltage produced by the resistance 406 and can be implemented, for example, by an operational amplifier connected as a source follower or by some other operational amplifier with non-unity gain. In this way, the voltage produced by the resistance 406 can be applied to the ring oscillator 204 via the control signal 208 and remain stable, independent of the current load of the ring oscillator 204.

FIG. 5 illustrates an exemplary circuit implementation of the variable current mirror 404 in accordance with embodiments of the present disclosure. As shown in FIG. 5, the variable current mirror 404 includes a diode connected transistor 502 and a "transistor" 504 with a variable channel width to length ratio. The transistor 504 specifically includes a plurality of transistors that can be selectively coupled or decoupled by the switches 506 to a parallel combination of transistors that form the transistor 504. The more transistors in the parallel combination, the larger the channel width to length ratio of the transistor 504.

Because the gates of each transistor in the parallel combination of transistors that form the transistor 504 are coupled to the gate of the transistor 502, the parallel combination will mirror the reference current (i.e., Iref) flowing through the transistor 502 and produce a replica current (i.e., Irep) that is approximately proportional to the reference current. The magnitude of the replica current will specifically be controlled by the number of transistors in the parallel combination of transistors that form the transistor 504. In general, the more transistors in the parallel combination the larger the replica current produced. As can be seen from FIG. 5, the tuning word 118 can be used to control the switches 506 that determine the number of transistors in the parallel combination of transistors and, thereby, the magnitude of the replica current produced.

It should be noted that although PFETs are used in the implementation of the variable current mirror 404 shown in FIG. 4, other transistor types can be used. For example, NFETs can be used.

In addition, it should be noted that the digital value of the tuning word 118 used to control the switches 506 can be, for example, a binary number or a thermometer code. A thermometer code has one digital bit for each possible, non-zero decimal number that it can represent, and the decimal number a thermometer code encodes is equivalent to the number of non-zero bits it includes. Thus, a thermometer code that can represent 8 different non-zero decimal numbers (e.g., decimal numbers 1-8) will have 8 digital bits and the number of those bits that are non-zero indicates the decimal number that the thermometer code encodes (e.g., the thermometer code '00000111' encodes decimal number 3 and the thermometer code '00111111' encodes decimal number 6).

FIG. 6 illustrates an exemplary circuit implementation of the weak inversion structure 402 and includes the two transistors 602 and 604. The transistor 602 is operating in the strong inversion region and the transistor 604 is operating in the weak inversion or sub-threshold region. The gates of the two transistors are coupled to the drain of the transistor 602, and the source of the transistor 602 is coupled to drain of the transistor 604.

Because the transistor 604 is operating in the weak inversion or sub-threshold region of operation, the voltage Vx is proportional to absolute temperature and is further independent of supply voltage variations. The voltage Vx can be used to set the reference current (i.e., Iref) flowing through the diode connected transistor 502 shown in FIG. 5.

A bias current, flowing through the channels of transistors 602 and 604 can be provided by another transistor (not shown) that is coupled at its gate to transistor 502.

It should be noted that although NFETs are used in the implementation of the weak inversion structure 404 shown in FIG. 6, other transistor types can be used. For example PFETs can be used.

FIG. 7 illustrates an exemplary circuit implementation of the resistance 406 and includes two transistors 702 and 704. Transistor 702 is a PFET and transistor 704 is an NFET. The gate, drain, and source of the transistor 702 are all coupled to the gate and drain of the transistor 702. Both transistors are operating in the weak inversion region of operation. The resistance 406 is provided across the source of transistor 702 and the source of transistor 704 and can be extremely high because the two transistors 702 and 704 are operating in the weak inversion region.

It should be noted that although NFETs are used in the implementation of the resistance 406 shown in FIG. 7, other transistor types can be used. For example PFETs can be used.

III. RING OSCILLATOR INVERTING STAGE

This section describes an embodiment of the present disclosure that is separate and distinct from Section II just described above. In particular, Section II above was directed to an embodiment of the decoder 202, whereas this section is directed to an embodiment of the inverting stage 302.

Figures 8, 9:
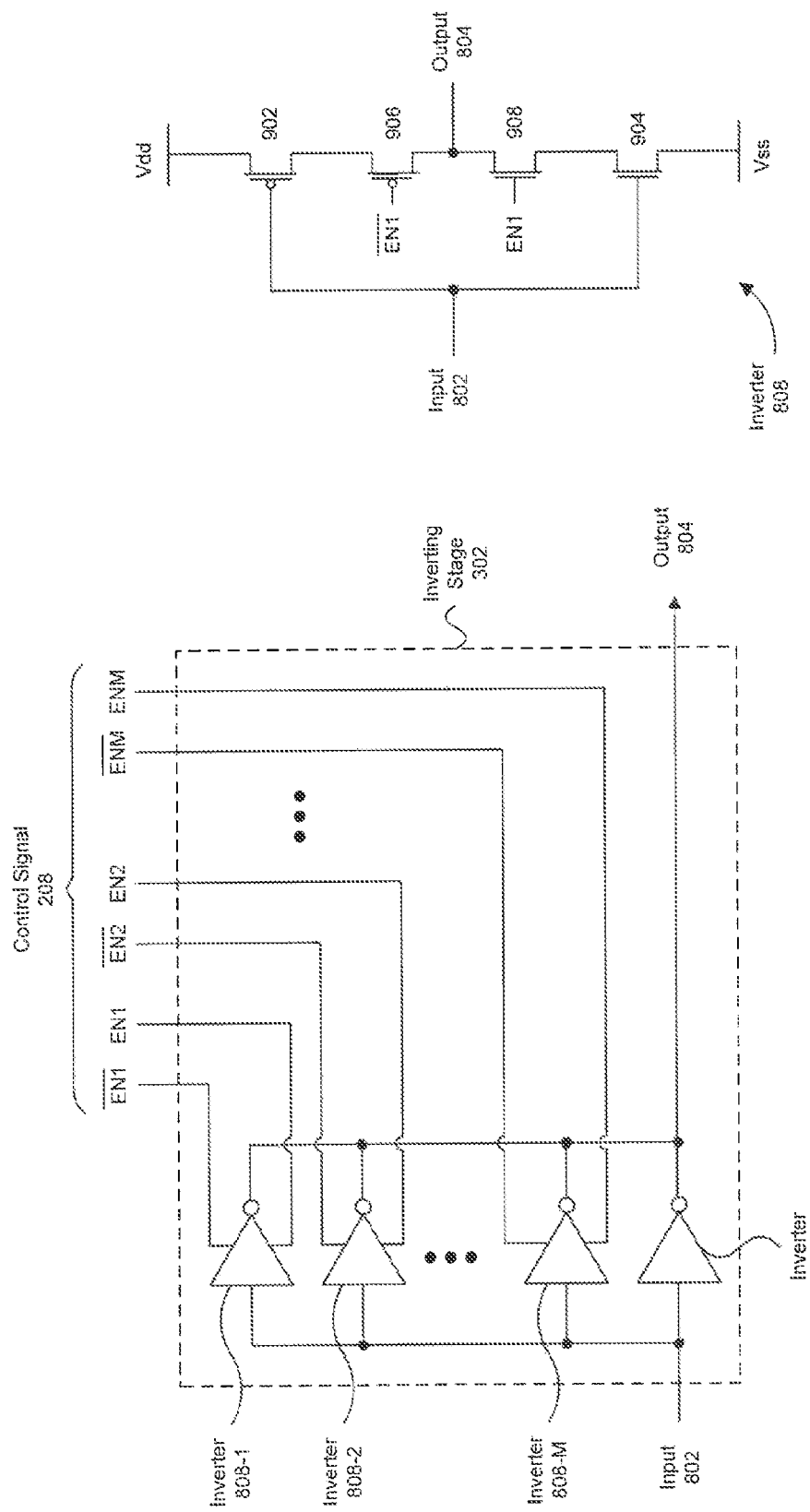
FIG. 8 illustrates an exemplary inverting stage for a ring oscillator in accordance with embodiments of the present disclosure.
FIG. 9 illustrates an exemplary inverter in accordance with embodiments of the present disclosure.

Referring now to FIG. 8, an exemplary implementation of an inverting stage 302 for the ring oscillator 204 illustrated in FIG. 2 in accordance with embodiments of the present disclosure is shown. As noted above in Section I, the ring oscillator 204 includes a plurality of series coupled inverting stages that each receive and invert the output of one of the other inverting stages in the series. The frequency of the output oscillating signal 102 produced by the ring oscillator 204 is approximately equal to the reciprocal of twice the sum of the individual stage or gate delays of all the inverting stages (and any buffer stages) included in the ring oscillator 204.

The inverting stage 302, shown in FIG. 8, includes a plurality of parallel coupled inverters 808-1 through 808-M and an inverter 806. The inverter 806 and the inverters 808-1 through 808-M are configured to invert the output of another inverting stage received at the input 802. The inverted signal is provided as output by the output 804.

The inverters 808-1 through 808-M are selectively enabled and disabled by the control signal 208. The stage or gate delay of the inverting stage 302 is therefore adjusted by the control signal 208. In general, the more of the inverters 808-1 through 808-M that are enabled, the smaller the stage or gate delay of the inverting stage 302 and the faster the frequency of the output oscillation signal 102. This is because only enabled ones of the inverters 808-1 through 808-M source and sink an output current to respectively charge and discharge the capacitive load of the stage or gate coupled to the output 804. The amount of current an inverter sources or sinks can be referred to as its drive strength. The more of the inverters 808-1 through 808-M that are enabled, the larger the current used to charge and discharge the capacitive load of the stage or gate coupled to the output 804, and the smaller the stage or gate delay of the inverting stage 302.

In an embodiment, the inverters 808-1 through 808-M are scaled in size to provide different drive strengths. For example, the inverters can be scaled in size to provide different drive strengths according to a binary scale. In another embodiment, the inverters shown in the inverting stages 302 can be replaced by buffers to provide a buffer stage with a variable stage or gate delay.

FIG. 9 illustrates an exemplary circuit implementation of an inverter 808 that can be selectively enabled or disabled according to embodiments of the present disclosure. As shown in FIG. 9, the inverter 808 implements a basic complimentary metal oxide semiconductor (CMOS) inverter structure using a PFET transistor 902 and a NFET transistor 904. However, to provide for selective enabling and disabling, the inverter 808 further includes a PFET transistor 906 and a NFET transistor 908 that are both turned off by the control signal 208 to disable the inverter 808 and both turned on to enable the inverter 808. It should be noted that the inverter 808 can be implemented as a differential inverter in other embodiments.

IV. CONCLUSION

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

What is claimed is:

1. An apparatus for providing an output oscillating signal at a desired frequency, the apparatus comprising:
    a weak inversion structure configured to set a reference current, wherein the weak inversion structure comprises a first transistor operating in a strong inversion region and a second transistor operating in a sub-threshold region, wherein a gate of the first transistor and a gate of the second transistor are coupled to a drain of the first transistor, wherein a source of the first transistor is coupled to a drain of the second transistor;
    a current mirror configured to provide a replica current based on the reference current and a tuning word; and
    a ring oscillator configured to be powered by a supply at a voltage determined based on the replica current,
    wherein the tuning word is adjustable to change the voltage such that the ring oscillator provides the output oscillating signal at the desired frequency.

2. The apparatus of claim 1, further comprising:
    a resistance configured to convert the replica current into the voltage.

3. The apparatus of claim 2, wherein the resistance is implemented using a transistor operating in the sub-threshold region.

4. The apparatus of claim 1, wherein the ring oscillator comprises:
    a plurality of series coupled inverting stages powered by the supply at the voltage.

5. The apparatus of claim 4, wherein the plurality of series coupled inverting stages comprise:
    a p-channel field effect transistor (PFET) coupled at a source terminal to the voltage.

6. The apparatus of claim 1, wherein the current mirror comprises:
    transistors coupled in parallel and configured to provide the replica current, wherein a number of the transistors coupled in parallel is determined based on the tuning word.

7. The apparatus of claim 1, further comprising:
    a frequency divider configured to estimate a ratio of a frequency of the output oscillating signal to a frequency of a reference oscillating signal to provide a comparison signal;
    a frequency detector configured to compare the comparison signal to a desired frequency ratio to provide an adjustment signal; and
    a filter configured to adjust the tuning word based on the adjustment signal.

8. An apparatus for providing an output oscillating signal at a desired frequency, the apparatus comprising:
    a current mirror configured to provide a replica current based on a reference current and a tuning word;
    a resistance configured to convert the replica current into a voltage, wherein the resistance comprises a first transistor operating in a sub-threshold region and a second transistor operating in the sub-threshold region, wherein a gate, drain, and source of the first transistor are coupled to a gate and drain of the second transistor; and
    a ring oscillator configured to be powered by a supply at the voltage, wherein the tuning word is adjustable to change the voltage such that the ring oscillator provides the output oscillating signal at the desired frequency.

9. The apparatus of claim 8, further comprising:
a weak inversion structure comprising a first transistor operating in the sub-threshold region, the weak inversion structure being configured to set the reference current.

10. The apparatus of claim 8, wherein the ring oscillator comprises:
a plurality of series coupled inverting stages powered by the supply at the voltage.

11. The apparatus of claim 10, wherein the plurality of series coupled inverting stages comprise:
a p-channel field effect transistor (PFET) coupled at a source terminal to the voltage.

12. The apparatus of claim 8, wherein the current mirror comprises:
transistors coupled in parallel and configured to provide the replica current, wherein a number of the transistors coupled in parallel is determined based on the tuning word.

13. The apparatus of claim 8, further comprising:
a frequency divider configured to estimate a ratio of a frequency of the output oscillating signal to a frequency of a reference oscillating signal to provide a comparison signal;
a frequency detector configured to compare the comparison signal to a desired frequency ratio to provide an adjustment signal; and
a filter configured to adjust the tuning word based on the adjustment signal.

14. An apparatus for providing an output oscillating signal at a desired frequency, the apparatus comprising:
a weak inversion structure configured to set a reference current, wherein the weak inversion structure comprises a first transistor operating in a strong inversion region and a second transistor operating in a sub-threshold region, wherein a gate of the first transistor and a gate of the second transistor are coupled to a drain of the first transistor, wherein a source of the first transistor is coupled to a drain of the second transistor;
a current mirror configured to provide a replica current based on the reference current and a tuning word;
a ring oscillator comprising a transistor configured to be powered by a supply at a voltage determined based on the replica current;
a frequency divider configured to estimate a ratio of a frequency of the output oscillating signal to a frequency of a reference oscillating signal to provide a comparison signal;
a frequency detector configured to compare the comparison signal to a desired frequency ratio to provide an adjustment signal; and
a filter configured to adjust the tuning word based on the adjustment signal.

15. The apparatus of claim 14, further comprising:
a resistance configured to convert the replica current into the voltage.

16. The apparatus of claim 15, wherein the resistance is implemented using a transistor operating in the sub-threshold region.

17. The apparatus of claim 14, wherein the ring oscillator comprises:
a plurality of series coupled inverting stages powered by the supply at the voltage.

18. The apparatus of claim 17, wherein the plurality of series coupled inverting stages comprise:
a p-channel field effect transistor (PFET) coupled at a source terminal to the voltage.

19. The apparatus of claim 14, wherein the current mirror comprises:
transistors coupled in parallel and configured to provide the replica current, wherein a number of the transistors coupled in parallel is determined based on the tuning word.

* * * * *

UNITED STATES PATENT AND TRADEMARK OFFICE
CERTIFICATE OF CORRECTION

| | | |
|---|---|---|
| PATENT NO. | : 8,742,856 B2 | Page 1 of 1 |
| APPLICATION NO. | : 13/436564 | |
| DATED | : June 3, 2014 | |
| INVENTOR(S) | : Frantzeskakis et al. | |

It is certified that error appears in the above-identified patent and that said Letters Patent is hereby corrected as shown below:

On the title page, item [75] please replace "Georgios Srikas" with --Georgios Sfikas--.

Signed and Sealed this
Fifth Day of August, 2014

Michelle K. Lee
*Deputy Director of the United States Patent and Trademark Office*